United States Patent
Sakuma et al.

[11] Patent Number: 6,103,133
[45] Date of Patent: Aug. 15, 2000

[54] MANUFACTURING METHOD OF A DIAMOND EMITTER VACUUM MICRO DEVICE

[75] Inventors: Naoshi Sakuma; Tomio Ono; Tadashi Sakai, all of Yokohama, Japan

[73] Assignee: Kabushiki Kaisha Toshiba, Kawasaki, Japan

[21] Appl. No.: 09/042,738

[22] Filed: Mar. 17, 1998

[30] Foreign Application Priority Data

Mar. 19, 1997 [JP] Japan ................................... 9-065638
Mar. 19, 1997 [JP] Japan ................................... 9-065642

[51] Int. Cl.⁷ .............................. H01J 9/02; B44C 1/22; C23C 14/34
[52] U.S. Cl. ..................... 216/11; 216/54; 204/192.22; 445/24; 445/50
[58] Field of Search .................. 216/11, 24; 445/24, 445/50; 313/309, 336, 351, 169.3, 169.4; 428/408; 438/692; 204/192.22, 192.15

[56] References Cited

U.S. PATENT DOCUMENTS

| | | | |
|---|---|---|---|
| 3,814,968 | 6/1974 | Nathanson et al. ...................... | 313/309 |
| 5,141,460 | 8/1992 | Jaskie et al. .............................. | 445/24 |
| 5,312,514 | 5/1994 | Kumar ............................... | 204/192.15 |
| 5,382,867 | 1/1995 | Mauro et al. ........................... | 313/309 |
| 5,386,172 | 1/1995 | Komatsu ................................. | 313/309 |
| 5,517,075 | 5/1996 | Vickers .................................... | 313/309 |
| 5,536,193 | 7/1996 | Kumar ...................................... | 445/50 |
| 5,608,283 | 3/1997 | Twitchell et al. ....................... | 313/309 |
| 5,652,083 | 7/1997 | Kumar et al. ...................... | 204/192.15 |
| 5,725,664 | 3/1998 | Nanbu et al. .............................. | 118/52 |
| 5,747,918 | 5/1998 | Eom et al. ............................... | 313/309 |
| 5,792,556 | 8/1998 | Ishikura et al. ......................... | 428/408 |
| 5,800,879 | 9/1998 | Moran et al. ...................... | 204/192.22 |
| 5,804,503 | 9/1998 | Leidy et al. ............................. | 438/692 |
| 5,808,408 | 9/1998 | Nakamoto ............................... | 313/309 |
| 5,825,126 | 10/1998 | Kim ........................................ | 313/309 |

FOREIGN PATENT DOCUMENTS 7-282715  10/1995  Japan .
9-265892  10/1997  Japan .

OTHER PUBLICATIONS

Hirohiko Murakami, et al., IUMRS–ICA–97 Abstracts, pp. 334, Sep. 16–18, 1997, "Fabrication of 50–nm SI Spikes Topped with Diamond Particles: New Field Emitters?"

Primary Examiner—Nam Nguyen
Assistant Examiner—Gregg Cantelmo
Attorney, Agent, or Firm—Oblon, Spivak, McClelland, Maier & Neustadt, P.C.

[57] ABSTRACT

The present invention intends to provide a manufacturing method of a vacuum micro device, including the steps of forming diamond nuclei on a substrate, forming emitters by etching the substrate with use of the diamond nuclei as a mask, forming an insulating layer and a gate electrode layer as a gate electrode on the emitters, such that the insulating layer and the gate electrode layer are stacked in order, and exposing the diamond nuclei by partially etching the gate electrode layer and the insulating layer.

18 Claims, 5 Drawing Sheets

MANUFACTURING METHOD OF A DIAMOND EMITTER VACUUM MICRO DEVICE

BACKGROUND OF THE INVENTION

This invention relates to the manufacturing method of a vacuum micro device having an electron emission type cold cathode.

The electron emission type vacuum micro device can be a self-emission type display with high-definition, which can attain better high-speed responsibility, better radiation resistance, and better heat resistance, in comparing with the conventional device, and thus has been actively studied in recent years.

The emitters of the vacuum micro device are formed from a material having small electron affinity. For example, the electron affinity of diamond has been found to be almost 0 by the recent study (J. Van et al.: J. Vac. Sci. Technol. B, 10, 4 [1992]), and plenty of studies have been dedicated to the manufacturing methods of the vacuum micro device having emitters formed from diamond.

One (V. V. Zhiron: J. Vac. Sci. Technol. B13(2), March/April: 1995) of the studies proposes a method wherein on a Si substrate, the base of each of the emitters is processed to form columns each having a height of 100 $\mu$m and a diameter of several $\mu$m, and a Si—Au alloy is formed at the tip of the column, and then the tip is sharpened by an etching or oxidation technique.

According to this method, the sharpened Si emitter tips are then coated with diamond. The diamond-coated emitters formed in this manner are, however, less stable and reliable since the Si emitter tips are not uniformly coated with diamond.

The diamond emitter has been also formed by another method: (1) by coating a conical conductor (e.g. Mo) with diamond; and (2) by filling a tip type mold formed in a Si substrate by the anisotoropic etching or the like with diamond.

According to the method (1), however, the coating of diamond is formed in particles and adhered to the conductor at random. The emitters formed in this manner have less stability and reproducibility in the emitter characteristics. While, according to the method (2), the shape of the diamond emitter can be attained with good reproducibility, but the Si substrate used for forming the tip type mold must be perfectly removed to expose the emitters after forming the diamond emitters. With such an additional step, the manufacturing cost of the device will increase.

BRIEF SUMMARY OF THE INVENTION

The present invention has been developed in consideration of the above-mentioned developing condition of the vacuum micro device, and intends to provide a manufacturing method of a new vacuum micro device comprising emitters each having diamond at a tip of the base of each emitter, and the property of diamond can be sufficiently utilized.

The other object of the present invention is to provide a manufacturing method of a new vacuum micro device capable of improving stability and reproducibility of the diamond emitters, and reducing the manufacturing cost.

The present invention is characterized in that diamond nuclei grow on the material as the emitter base, and the emitter base is processed with use of the diamond nuclei as a mask, to form emitters having diamond only at a tip of each emitter base.

In order to obtain the above-mentioned object, according to the first aspect of the present invention, there is provided a manufacturing method of a vacuum micro device, comprising the steps of: forming diamond nuclei on a substrate; forming emitters by etching the substrate with use of the diamond nuclei as a mask; stacking an insulating layer and a gate electrode layer as a gate electrode on the emitters, in order; and exposing the diamond nuclei by partially etching the gate electrode layer and the insulating layer.

According to the second aspect of the present invention, there is provided the above manufacturing method further comprising the steps of: stacking a resist on the gate electrode layer after stacking the gate electrode layer on the insulating layer; and etching the resist to expose a part of the gate electrode layer.

According to the third aspect of the present invention, there is provided the manufacturing method according to the first aspect, the diamond nuclei are provided with tops of the diamond nuclei, respectively.

According to the fourth aspect of the present invention, there is provided the manufacturing method according to the first aspect, wherein the diamond nuclei have a diameter smaller than 1 $\mu$m.

According to the fifth aspect of the present invention, there is provided the above manufacturing method according to the first aspect of the present invention, wherein the diamond nuclei have a length smaller than 1 $\mu$m.

According to the sixth aspect of the present invention, there is provided the manufacturing method according to the first aspect, wherein the diamond nuclei are formed by using a mixed gas of hydrogen and acetone.

According to the seventh aspect of the present invention, there is provided the manufacturing method according to the first aspect, wherein the substrate is etched by the reaction ion etching.

According to the eighth aspect of the present invention, there is provided the manufacturing method according to the first aspect, wherein the insulating film is an oxide film.

According to the ninth aspect of the present invention, there is provided the manufacturing method according to the first aspect, wherein the insulating film is formed by sputtering.

According to the tenth aspect of the present invention, there is provided the manufacturing method according to the first aspect, wherein the gate electrode layer is formed from a metal having a high melting point.

According to the eleventh aspect of the present invention, there is provided the manufacturing method according to the second aspect, wherein a part of the resist is etched by chemical dry etching.

According to the twelfth aspect of the present invention, there is provided the manufacturing method according to the second aspect, wherein a part of the resist is etched with use of a mix of $CF_4$ gas and $O_2$ gas.

According to the thirteenth aspect of the present invention, there is provided the manufacturing method according to the first aspect, wherein a part of the gate electrode is etched by chemical dry etching.

According to the fourteenth aspect of the present invention, there is provided the manufacturing method according to the first aspect, wherein a part of the gate electrode layer is etched with use of a mix of $CF_4$ gas and $O_2$ gas.

According to the fifteenth aspect of the present invention, there is provided the above manufacturing method wherein a part of the insulating film is etched by the wet etching using ammonium fluorescent bodyide solution.

According to the sixteenth aspect of the present invention, there is provided the manufacturing method according to the second aspect, further comprising the step of removing the resist after the step of exposing the diamond nuclei.

According to the seventeenth aspect of the present invention, there is provided the manufacturing method according to the first aspect, wherein the insulating layer is a SOG insulating film.

According to the eighteenth aspect of the present invention, there is provided the manufacturing method according to the seventeenth aspect of the present invention, wherein the step of forming the SOG insulating film includes the steps of performing a first heat treatment after forming the SOG insulating film on the emitter, and performing a second heat treatment at a temperature higher than that of the first heat treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the present invention will be described below with reference to the drawings.

The First Embodiment

According to the present invention, a vacuum micro device having stable characteristics can be realized.

FIGS. 1–9 are sectional views showing each step of the manufacturing process of the vacuum micro device according to the first embodiment of the present invention.

Figure 1:
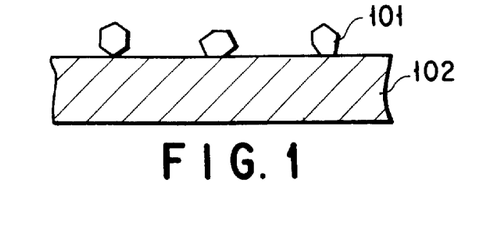
FIGS. 1–9 are sectional views of a vacuum micro device for showing a step of the manufacturing process according to the first aspect of the present invention.

Firstly, diamond nuclei 101 are formed on the first substrate as an emitter base, e.g. a Si substrate 102, as shown in FIG. 1. In this manner, the diamond nuclei used in the present embodiment are formed at an early stage of the diamond growth process.

The diamond nuclei are formed on the substrate at a rate of $10^8$ nuclei/cm$^2$. With this rate, $10^8$ diamond nuclei are present in an area of 1 cm$^2$ at intervals of 1 μm. In other words, the emitters can be formed at intervals smaller than 1 μm. In this embodiment, the diamond nuclei are formed in accordance with the hot-filament method. According to this method, the diamond nuclei can be formed to have an average size of about 1 μm.

In the diamond nuclei forming process, a mix of hydrogen with a flow rate of 100 sccm and acetone with a flow rate of 0.5 sccm is introduced into a reaction chamber, and a reaction pressure of 100 Torr and by setting a substrate temperature at 800° C. is used.

Figure 2:
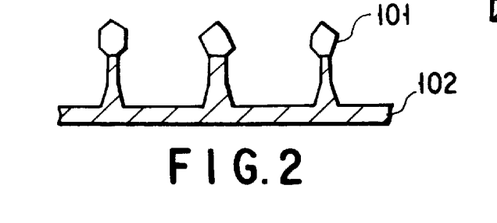

The nuclei growing time is one hour, and the average diameters of the grown nuclei is approximately 200 nm. Next, as shown in FIG. 2, the Si substrate as the emitter base is etched with use of the diamond nuclei as a mask.

In this time, it is preferable to etch the Si substrate such that the etching depth is five times larger than the average particle diameter of the diamond nuclei. The sizes of the diamond nuclei vary, and thus the emitters need to have a sufficient height with respect to the diameters of the diamond nuclei in order to unify the characteristics of the emitters. The Si substrate is etched in accordance with the reactive ion etching method (RIE) to etch by a predetermined depth. According to the present invention, the etching is performed to obtain a 1 μm depth. By this step, the shape of the emitter is determined.

Figure 3:
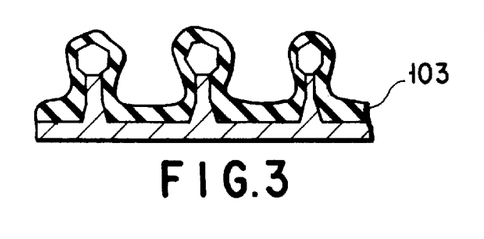

Next, as shown in FIG. 3, the material from which a gate insulating layer 103 is formed, e.g. an oxide film is formed by the sputtering method on an entire surface of the substrate such that the formed film covers an entire surface of the emitter. In this embodiment, the film is formed to have a thickness of 1 μm.

Figure 4:
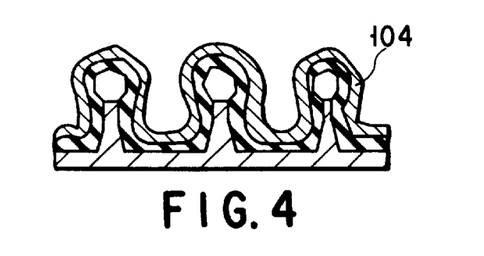

After forming the gate insulating film, a gate electrode 104 is formed on the oxide film 103, as shown in FIG. 4. In this embodiment, the electrode is formed by the sputtering molybdenum to have a thickness of 500 nm.

Figure 5:
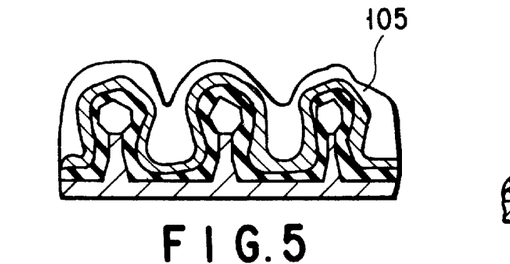

Subsequently, a resist 105 is applied to an entire surface of the substrate with use of a spinner. In the present embodiment, the resist is applied to have a thickness of approximately 1 μm, and the substrate is subjected to a heat treatment at 150° C. for 30 minutes.

Figure 6:
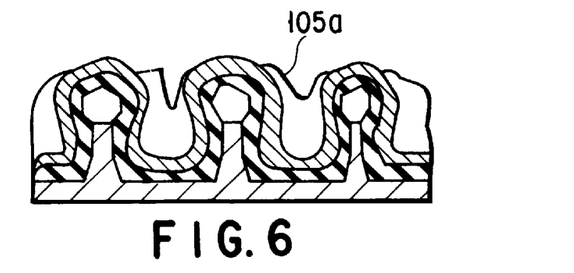

Then, as shown in FIG. 6, the resist 105 is etched to expose a part of a Mo film as the gate electrode 104 on the diamond nuclei. It is to be noted the Mo film has a high melting point. The etch back process can be performed by the chemical dry etching (CDE) method or the like.

This etch back is performed under such a condition wherein a mix of CF$_4$ gas with a flow rate of 140 sccm and O$_2$ gas with a flow rate of 90 sccm is used to etch the resist under a reaction pressure of 0.5 Torr by applying microwave power of 600 W.

Figure 7:
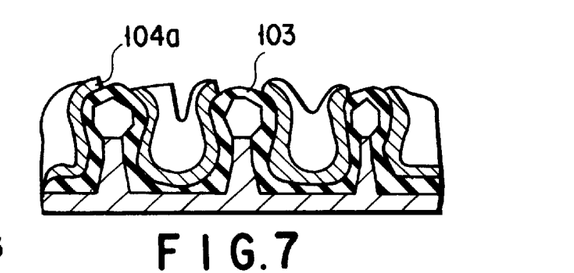

As shown in FIG. 7, the gate electrode 104 is then etched by using as a mask the resist 105a etched in the former step shown in FIG. 6. The etching is performed in accordance with the CDE method, similarly to the resist etching step. The etching condition is set to be the same as that of the resist etching step.

According to the CDE method, the selection ratio between Mo as the gate electrode 104, and the oxide as the gate insulating layer 103 can be set large, and thus the etching can be easily stopped at the time when the gate insulating layer 103 is exposed.

Figure 8:
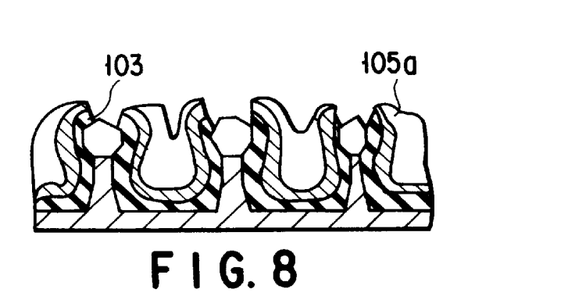

Subsequently, the gate insulating layer 103 is subjected to the wet etching process using specified chemicals to expose a part of the diamond nuclei 101, as shown in FIG. 8. In the wet etching process, ammonium fluoride solution is used for etching the oxide film. After 5 minutes etching is performed to expose the diamond nuclei 101, an additional etching is performed for 30 seconds.

Figure 9:
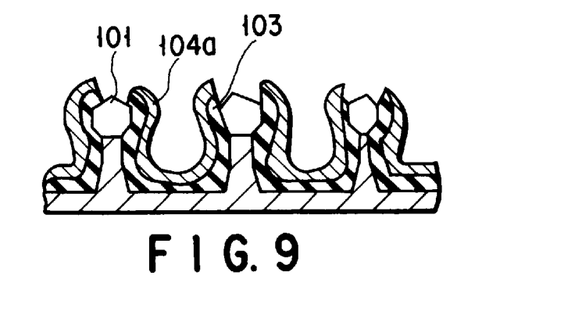

At the last of the process, the resist 105a is removed as shown in FIG. 9. The resist 105a is removed by heating a removing solution (HAKURI 10 manufactured by TOKYO OHKA CO.) to 80° C. and immersing the substrate therein for 10 minutes. After removing the resist, the substrate is rinsed with water and dried to obtain a finished vacuum micro device of the present embodiment.

In the above-mentioned embodiment, the oxide film is used as the gate insulating layer 103. The gate insulating layer 103 can be also formed of a SOG (Spin on Glass) insulating film.

FIGS. 19–27 are sectional views of a vacuum micro device according to the present invention, in which a SOG insulating film is formed.

The basic manufacturing method is the same as that shown in FIGS. 1–9, and will be described below in short.

Figure 19:
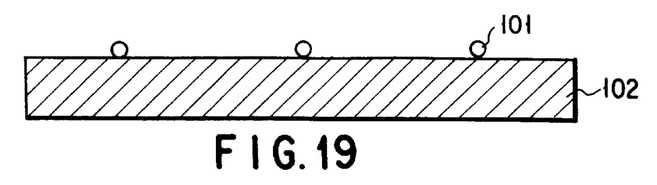
FIGS. 19–27 are sectional views of a vacuum micro device for showing steps of the manufacturing process according to the present invention, in which a SOG insulating film is formed.

At first, as shown in FIG. 19, diamond nuclei 101 are formed on the first substrate as the emitter base, on a Si substrate 102, for example. The diameter of the particles of the diamond nuclei is set at 200 nm.

Figure 20:
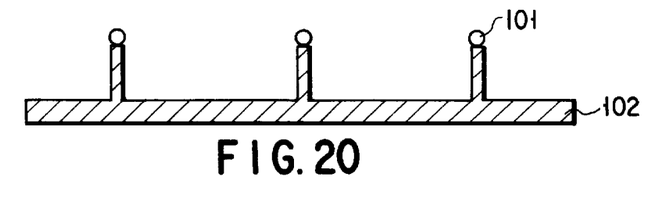

Next, the substrate 102 as the emitter base is etched with use of diamond nuclei 101 as a mask, as shown in FIG. 20, to obtain the etching depth of 800 nm. The etching depth is set four times larger than the average diameter of the particles of the diamond nuclei.

According to the manufacturing method of the vacuum micro device of the present embodiment, the gate insulating layer is formed of the SOG insulating film. The method according to this embodiment, thus advantageous in that the uniformity of the surface can be obtained and that the etching depth can be reduced in comparison with the case wherein the gate insulating layer is formed of an oxide film.

Figure 21:
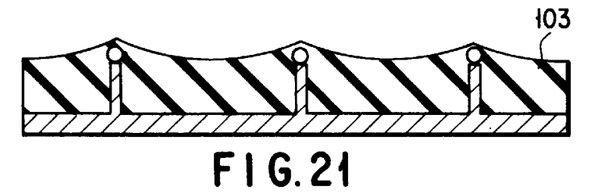

Next, as shown in FIG. 21, the SOG insulating film 103 as the gate insulating layer is applied to an entire surface of the substrate 102. The substrate 102 applied with the SOG insulating film 103 is then subjected to the heat treatment at 200° C. for an hour. Subsequent to this heat treatment, another heat treatment is performed thereon at 800° C. for an hour.

Figure 22:
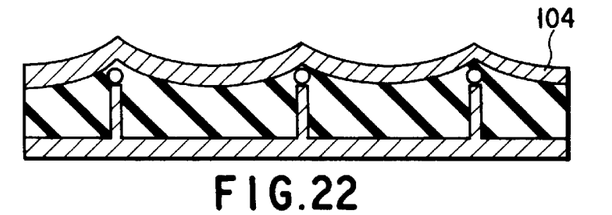
Figure 23:
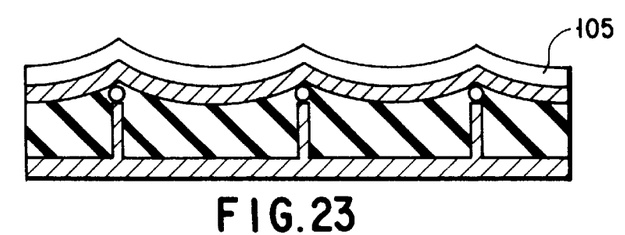
Figure 24:
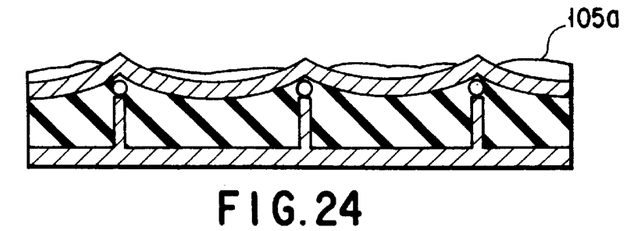

Thereafter, a gate electrode layer 104 is formed on the SOG insulating film 103 as shown in FIG. 22, and then a resist 105 is applied to an entire surface of the substrate 102, as shown in FIG. 23. The substrate 102 is then etched so that a part of the gate electrode layer 104 on the diamond nuclei is exposed as shown in FIG. 24.

Figure 25:
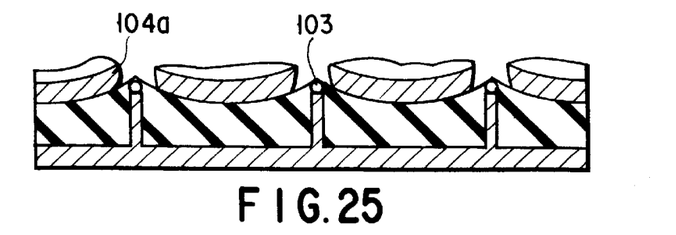
Figure 26:
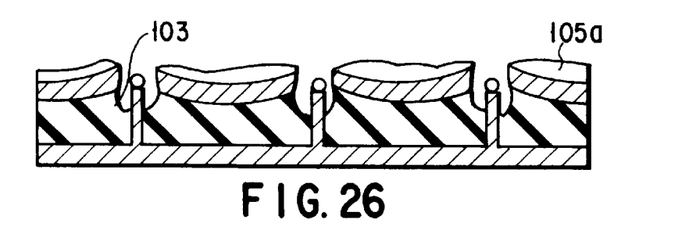
Figure 27:
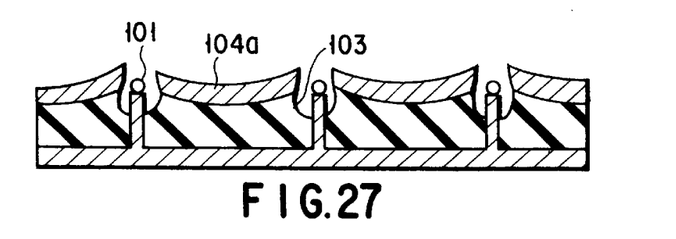

Subsequently, the gate electrode 104 is etched as shown in FIG. 25 and then the SOG insulating film 103 is etched by the wet etching to expose a part of the diamond nuclei 101, as shown in FIG. 26. Finally, a resist 105a is removed, as shown in FIG. 27.

According to the present embodiment, the diamond nuclei 101 need not to be uniformly arranged in an array at predetermined intervals. If the device has the diamond nuclei dispersed in a predetermined area at a predetermined range, the device can function as a vacuum micro device.

If the diamond nuclei need to be arranged in an array to increase the precision in arrangement, the nuclei may be grown by irradiating predetermined spots arranged in an array on the Si substrate 102 with a focused ion beam or the like.

According to the present embodiment, the emitters coated with diamond only at the tips of the emitter bases can be formed, and thus a vacuum micro device, which contains the emitters and can attain stable characteristics, can be obtained.

Further, the vacuum micro device of the present embodiment is advantageous in that the emitters are formed by etching the Si substrate with use of the fine diamond nuclei 101 as a mask, and thus the variation in distances between the anodes and the emitters can be suppressed.

The present invention is not limited to the embodiment described above, and that various changes and modifications may be effected therein by one skilled in the art without departing from the scope or spirit of the invention.

The following is the description of a plane image display device as an application of the vacuum micro device according to the above embodiment.

Figure 10:
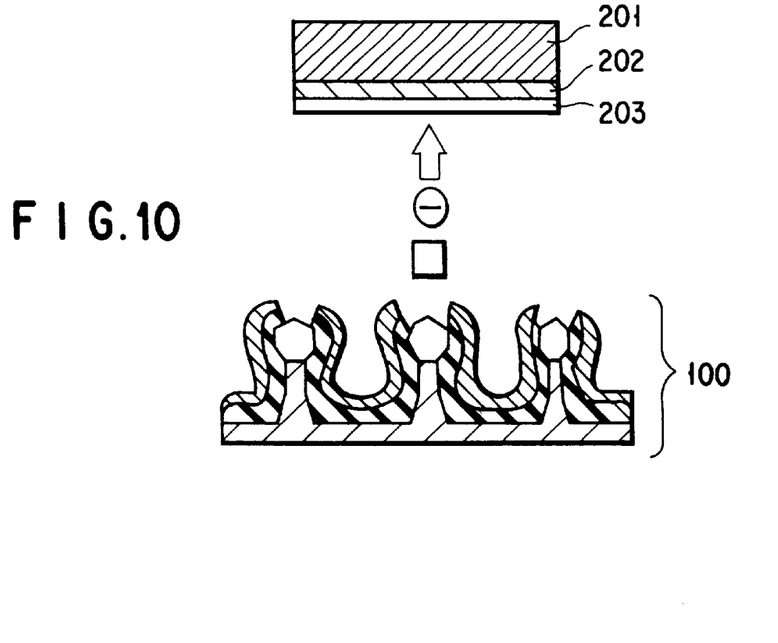
FIG. 10 is a sectional view of a plane image display device having a vacuum micro device according to the first aspect of the present invention.
Figure 28:
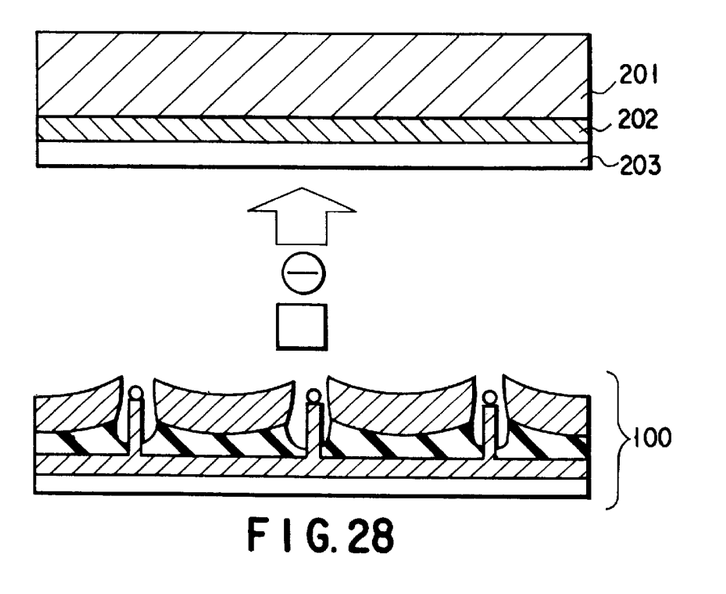
FIG. 28 is a sectional view of a plane image display device having a vacuum micro device having a SOG insulating film.

As shown in FIG. 10, the parallel plane image display device according the present embodiment, a Si substrate 102 (hereinafter referred to as "a vacuum micro device section 100") on which a plurality of emitters of vacuum micro devices are arranged to face at a distance a glass face plate 201 on which a transparent electrode layer (anode electrode) 202 comprising an ITO and a fluorescent body layer 203 are formed in order, to form a vacuum envelop. As should be clear from this structure, the vacuum micro device section 100 is formed as a part of the vacuum envelop. FIG. 28 shows a sectional view of a plane image display device which contains a vacuum micro device having a SOG insulating film.

In this embodiment, the diamond nuclei are used as emitters, but may be used only as a mask. By using the diamond nuclei as a mask, the emitters can be very sharply formed.

In the above embodiment, a thermal oxide film is formed after etching a Si substrate 102 with use of the diamond nuclei 101 as a mask. In this time, very sharpened emitters are formed on the Si substrate 102. The diamond nuclei are removed (lift-off) in removing the oxide film at the last of the process, to expose the very sharpened Si emitters are exposed.

With use of this method, the very sharpened Si emitters as described above can be obtained without the steps of exposing, developing, and patterning. It goes without saying that the vacuum micro device according to the present invention can be applied to a power device.

As described above, according to the present invention, the vacuum micro device capable of improving the stability and reproducibility of the shape of the diamond emitters, and remarkably reducing the manufacturing cost can be attained.

The Second Embodiment

In this embodiment, an oxide film as a gate insulating layer is formed on a Si substrate, and a Mo film as a gate electrode is formed thereon. Then, the gate insulating layer and the gate electrode are etched to form pin holes, and each diamond nuclei is formed in the corresponding hole.

The diameter of each pinhole is decreased as the diamond nuclei grow. With this phenomenon, each diamond nuclei grows in a conical shape. The diamond nuclei deposited on the Mo film have a very low adhesion to Mo, and thus can be easily peeled thereoff.

According to the present embodiment, not only the stability and the reproducibility of the diamond emitter shape as attained in the conventional technique can be obtained, but also the manufacturing cost can be remarkably reduced.

The present embodiment will be described below with reference to the drawings.

FIGS. 11–17 are sectional views showing each step of the manufacturing process of the vacuum micro device according to the second embodiment of the present invention.

Figure 11:
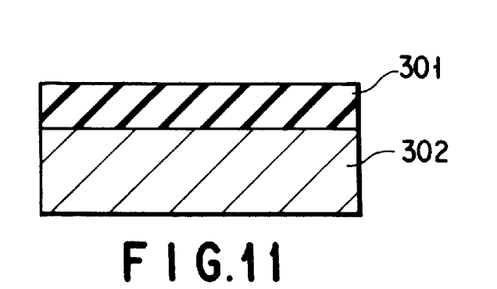
FIGS. 11–17 are sectional views of a vacuum micro device for showing a step of the manufacturing process according to the second aspect of the present invention.

At first, an oxide film as a gate insulating layer is formed on the first substrate 302, e.g. a Si substrate, as shown in FIG. 11. The oxide film can be formed by either of a thermal oxidation method and a plasma CVD method. In this embodiment, the thermal oxide film having a thickness of 2 $\mu$m is used.

Figure 12:
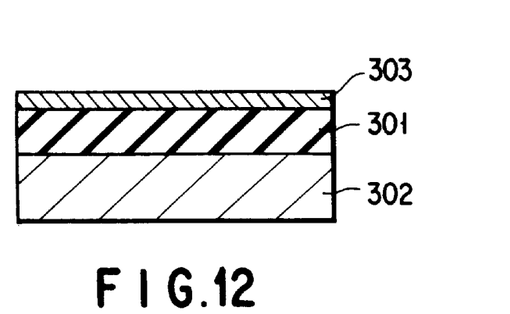
Figure 13:
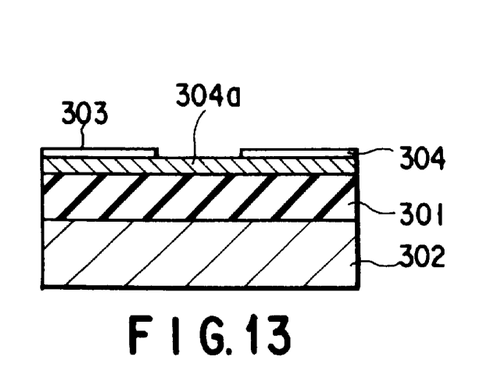
Figure 14:
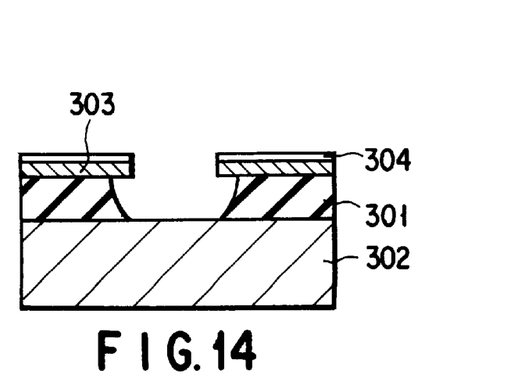

Next, a Mo film 303 as a gate electrode layer is formed on the oxide film 301 by the sputtering method, as shown in FIG. 12. In this embodiment, the Mo film formed to have a thickness of 0.5 $\mu$m. A resist 304 is applied to the surface of the Mo film by a spin coating method. The Mo film applied with resist is then subjected to general exposure and developing processes as shown in FIG. 13, and then patterning is performed thereon to obtain an opening 304a having a diameter 3 $\mu$m. Subsequently, the Mo layer as the gate electrode layer 303 and the thermal oxide $SiO_2$ film as the gate insulating layer 301 are etched by the reactive ion etching, for example, as shown in FIG. 14. After the etching, the resist 304 is removed.

Figure 15:
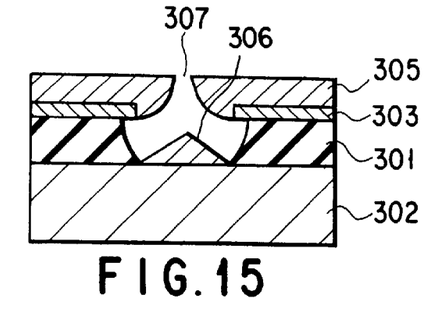
Figure 16:
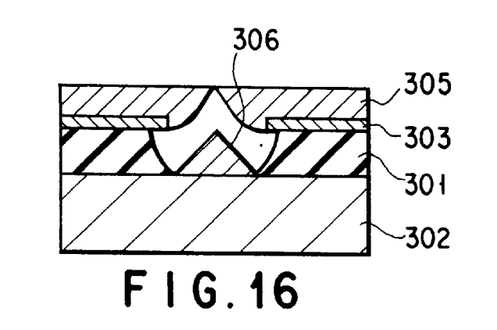

Next, as shown in FIG. 15, a diamond layer 305 and a diamond emitter 306 are formed on the substrate 301. In the present embodiment, the diamond layer 305 and the diamond emitter 306 are formed by the hot-filament method.

The hot-filament process for forming the diamond layer 305 and the diamond emitter 306 is performed with use of a mixed gas of hydrogen with a flow rate of 100 sccm and acetone with a flow rate of 0.5 sccm, under a reaction pressure of 100 Torr, on the substrate set at 800° C.

In this process, the diamond layer 305 grows also on the surface of the Mo layer 303 as the gate electrode layer so as to correspond to the growth of the diamond emitter 306, as shown in FIG. 15. The diamond layer 305 on the surface of the Mo layer 303 grows to close the opening 307 in the oxide layer 301 as the gate insulating layer and the Mo layer 303 as the gate electrode layer.

With this structure, the probability that the growing diamond seed reaches the Si substrate decreases as the time goes by. As the opening is closed, the diameter of the growing seed in the opening decreases, and thus the diamond 306 is formed in a conical or pyramidal shape. The growth has finished when the opening is completely closed.

Figure 17:
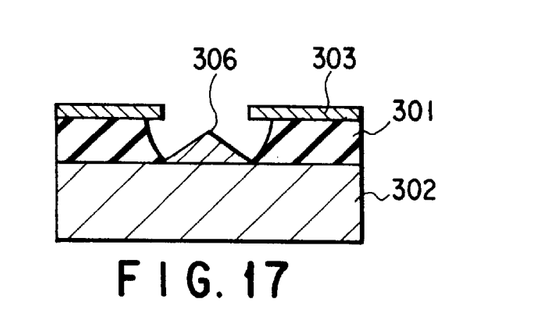

The diamond 305 deposited on the surface of the Mo layer 303 as the gate electrode layer has a very low adhesion to Mo, and thus can be easily peeled thereoff. The diamond seldom grows on the oxide film. Accordingly, an electric current can be prevented from flowing between the emitter 306 and the gate electrode layer 303 through the gate insulating layer 301, with no special processing. When the diamond 306 is peeled off the Mo layer 303, the complete vacuum micro device using the diamond emitter according to the present embodiment is obtained, as shown in FIG. 17.

Figure 18:
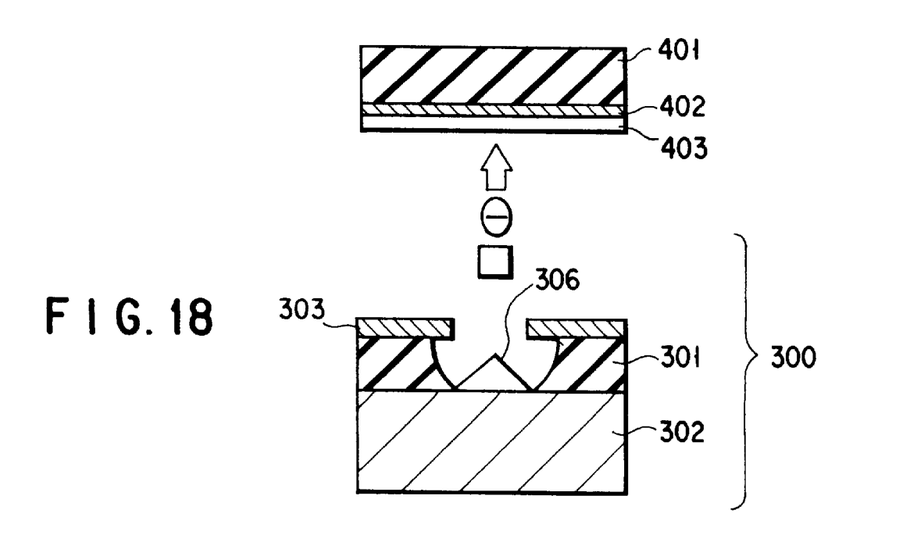
FIG. 18 is a sectional view of a plane image display device having a vacuum micro device according to the second aspect of the present invention.

The following is the description of a plane image display device containing the vacuum micro device according to the above embodiment. As shown in FIG. 18, the plane image display device according the present embodiment, a Si substrate 302 on which a plenty of pyramidal emitters of vacuum micro devices are arranged in an array (this drawing shows the sectional view of one of the emitters) to face at a distance a glass face plate 401 on which a transparent electrode layer (anode electrode) 402 comprising a ITO and a fluorescent body layer 403 are formed in order, to form a vacuum envelop.

In this embodiment, the diamond 306 formed in accordance with the manufacturing method of the vacuum micro device as described in the above embodiment is used as the emitter. The Si substrate 302 having the emitter thereon, and the Mo gate electrode 303 holding the insulating layer between the substrate and itself constitutes a vacuum micro device section 300.

As should be clear from this structure, the vacuum micro device section 300 is formed as a part of the vacuum envelop.

As described above, when the vacuum micro device is applied to the plain image displaying device, the stability and the reproducibility of the emitter shape in the plane image display device can be improved, and thus the image can be attained with higher precision and reliability in comparing with the conventional device.

It is further understood by those skilled in the art that the present invention is not limited to the above-mentioned embodiments and various changes and modifications may be made in the invention without departing from the spirit and scope thereof.

As described above, according to the present invention, the vacuum micro device capable of improving the stability and reproducibility of the diamond emitter shape, and remarkably reducing the manufacturing cost, can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a vacuum micro device, comprising:

forming diamond nuclei directly on a surface of a substrate;

forming emitters by etching the substrate with use of the diamond nuclei as a mask;

forming an insulating layer and a gate electrode layer as a gate electrode on the emitters, such that the insulating layer and the gate electrode layer are stacked in order; and exposing the diamond nuclei by partially etching the gate electrode layer and the insulating layer.

2. A manufacturing method according to claim 1, further comprising: stacking a resist on the gate electrode layer after stacking the gate electrode layer on the insulating layer; and etching the resist to expose a part of the gate electrode layer.

3. A manufacturing method according to claim 1, wherein the diamond nuclei are provided with tops of the emitters, respectively.

4. A manufacturing method according to claim 1, wherein the diamond nuclei are arranged to be separated from each other by a space less than 1 $\mu$m.

5. A manufacturing method according to claim 4, wherein the diamond nuclei have a diameter less than 1 μm.

6. A manufacturing method according to claim 1, wherein the diamond nuclei is formed using a mixes gas of hydrogen and acetone.

7. A manufacturing method according to claim 1, wherein the etching with respect to the substrate is performed by reactive ion etching.

8. A manufacturing method according to claim 1, wherein the insulating film is an oxide film.

9. A manufacturing method according to claim 1, wherein the insulating film is formed by sputtering method.

10. A manufacturing method according to claim 1, wherein the gate electrode layer is formed from a metal having a high melting point.

11. A manufacturing method according to claim 2, wherein a part of the resist is etched by chemical dry etching.

12. A manufacturing method according to claim 2, wherein a part of the resist is etched with use of a mix of $CF_4$ gas and $O_2$ gas.

13. A manufacturing method according to claim 1, wherein a part of the gate electrode is etched by chemical dry etching.

14. A manufacturing method according to claim 1, wherein a part of the gate electrode layer is etched with use of a mix of $CF_4$ gas and $O_2$ gas.

15. A manufacturing method according to claim 1, wherein a part of the insulating film is etched by wet etching using ammonium fluoride solution.

16. A manufacturing method according to claim 2, further comprising removing the resist after exposing the diamond nuclei.

17. A manufacturing method according to claim 1, wherein the insulating layer is a spin on glass (SOG) insulating film.

18. A manufacturing method according to claim 17, wherein forming the SOG insulating film includes performing a first heat treatment after forming the SOG insulating film on the emitter, and performing a second heat treatment at a temperature higher than that of the first heat treatment.

* * * * *